(12) United States Patent
Merimaa et al.

(10) Patent No.: US 9,928,842 B1
(45) Date of Patent: Mar. 27, 2018

(54) AMBIENCE EXTRACTION FROM STEREO SIGNALS BASED ON LEAST-SQUARES APPROACH

(71) Applicant: Apple Inc., Cupertino, CA (US)

(72) Inventors: Juha O. Merimaa, San Mateo, CA (US); Bruce C. Po, Los Altos, CA (US); Adam E. Kriegel, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/275,312

(22) Filed: Sep. 23, 2016

(51) Int. Cl.
| | |
|---|---|
| H03G 5/00 | (2006.01) |
| G10L 19/008 | (2013.01) |
| H04S 7/00 | (2006.01) |
| H04S 5/00 | (2006.01) |
| H04S 3/00 | (2006.01) |

(52) U.S. Cl.
CPC ............. G10L 19/008 (2013.01); H04S 7/30 (2013.01); H04S 7/307 (2013.01); *H03G 5/00* (2013.01); *H04S 3/002* (2013.01); *H04S 5/00* (2013.01)

(58) Field of Classification Search
CPC ......... G10L 19/008; G10H 1/06; H04S 7/307; H04S 7/30; H04S 3/002; H04S 5/00; H03G 5/00
See application file for complete search history.

(56) References Cited

U.S. PATENT DOCUMENTS

| | | | |
|---|---|---|---|
| 7,567,845 B1 | 7/2009 | Avendano et al. | |
| 8,103,005 B2 | 1/2012 | Goodwin et al. | |
| 8,107,631 B2 | 1/2012 | Merimaa et al. | |
| 8,705,769 B2 | 4/2014 | Vickers | |
| 9,088,855 B2* | 7/2015 | Goodwin | ................ H04S 3/008 |
| 9,307,338 B2 | 4/2016 | Usher et al. | |
| 9,426,575 B2 | 8/2016 | Kim | |
| 2014/0072124 A1 | 3/2014 | Stoecklmeier et al. | |

OTHER PUBLICATIONS

Faller, Christof, "Multiple-Loudspeaker Playback of Stereo Signals", J. Audio Eng. Soc., vol. 54, No. 11, pp. 1051-1064, Nov. 2006.

* cited by examiner

*Primary Examiner* — Andrew L Sniezek
(74) *Attorney, Agent, or Firm* — Womble Bond Dickinson (US) LLP

(57) ABSTRACT

Ambience extraction from a multichannel input signal is provided. The multichannel input signal is converted into a time-frequency representation. A cross-correlation coefficient is computed for each time and frequency in the time-frequency representation of the multichannel input signal. An autocorrelation is computed for each time and frequency in the time-frequency representation of the multichannel input signal. Using the cross-correlation coefficient and the autocorrelation, ambience extraction coefficients including crosstalk and same-side coefficients are computed as a function of a tuning parameter, the crosstalk coefficients being proportional to the tuning parameter and the tuning parameter being between a value of 0 and a value of 1. The ambience extraction coefficients are applied to extract a left ambience component and a right ambience component.

24 Claims, 5 Drawing Sheets

AMBIENCE EXTRACTION FROM STEREO SIGNALS BASED ON LEAST-SQUARES APPROACH

FIELD

One aspect of the disclosure herein relates to audio processing techniques for extracting ambience from audio signals.

BACKGROUND

Various techniques are available for extracting ambience components from a multi-channel stereo signal. The stereo signal may be decomposed into a primary component and an ambience component. One common application of these techniques is listening enhancement systems where ambient signal components are modified and/or spatially redistributed over multichannel loudspeakers, while primary signal components are unmodified or processed differently. In these systems, the ambience components are typically directed to surround speakers. This ambience redistribution helps to increase the sense of immersion in the listening experience without compromising the stereo sound stage.

BRIEF DESCRIPTION OF THE DRAWINGS

The embodiments herein are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

DETAILED DESCRIPTION

Figure 1:
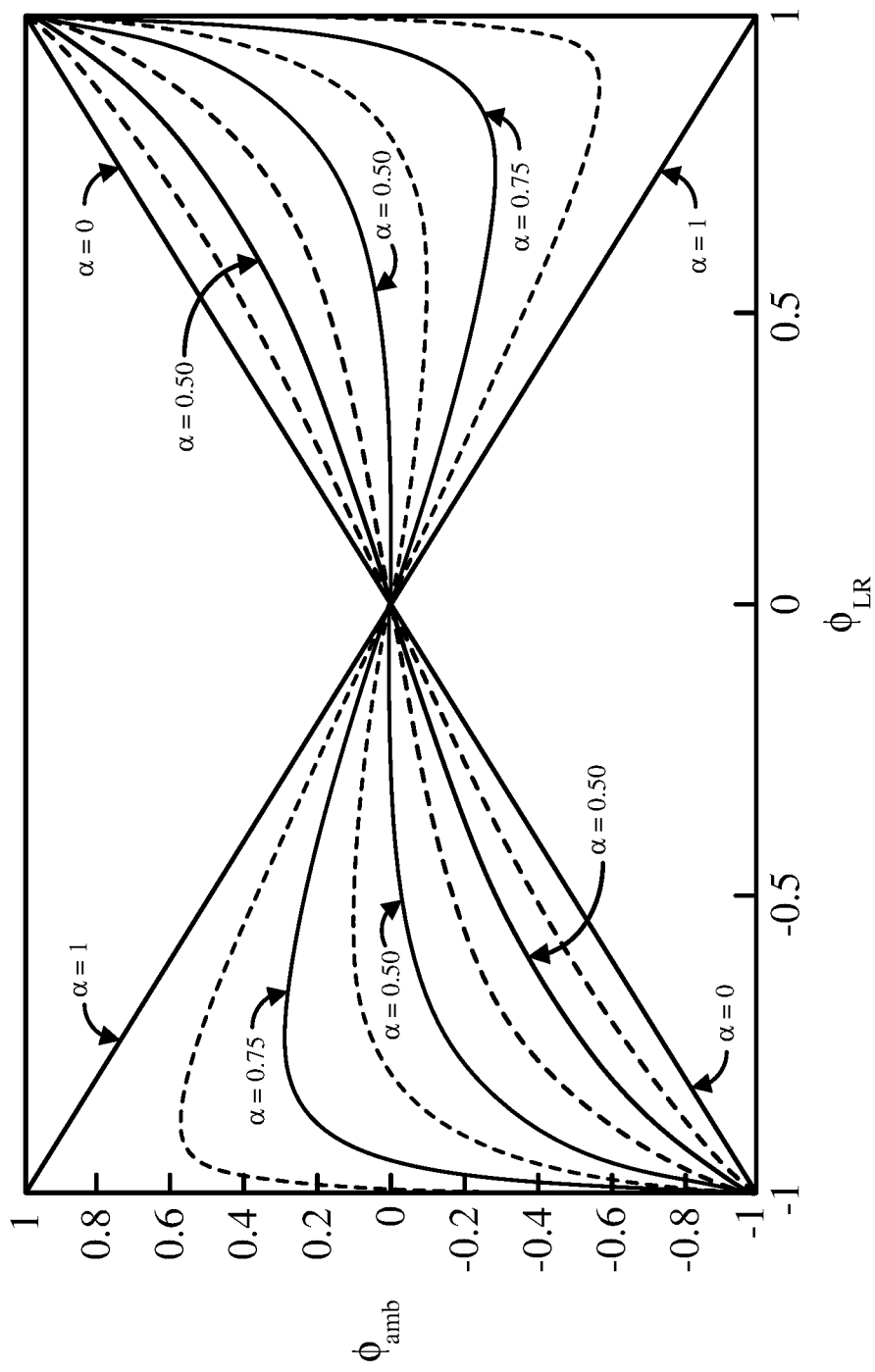
FIG. 1 illustrates a diagram for explaining the relationship between a cross-correlation coefficient of extracted ambience components and a cross-correlation coefficient of an input signal as a function of a tuning parameter, according to an example embodiment.

Several embodiments are now explained with reference to the appended drawings. Whenever aspects are not explicitly defined, the scope of the disclosure herein is not limited only to the parts shown, which are meant merely for the purpose of illustration. Also, while numerous details are set forth, it is understood that some embodiments may be practiced without these details. In other instances, well-known circuits, structures, and techniques have not been shown in detail so as not to obscure the understanding of this description.

In state-of-the-art stereo upmixing, it is common to distinguish between primary (direct) sound and ambience. The primary sound consists of localizable sound events and the usual goal of the upmixing is to preserve the relative locations and enhance the spatial image stability of the primary sources. The ambience, on the other hand, consists of reverberation or other spatially distributed sound sources. A stereo loudspeaker system is limited in its capability to render a surrounding ambience, but this limitation can be addressed by extracting the ambience and (partly) distributing it to the surround channels of a multichannel loudspeaker system (e.g., left and right channels). Embodiments described herein provide improved systems and methods for ambience extraction for use in spatial audio enhancement algorithms such as 2-to-N surround upmix, binaural rendering techniques, and immersive virtualization over loudspeakers.

An embodiment described herein aims to extract ambience components from a multi-channel stereo signal while enabling reduction of cross-correlation of the extracted ambience components and suppression of processing artifacts. In contrast to single-channel approaches, the multi-channel approach disclosed herein considers any undesired transfer of signals between channels (crosstalk) that may occur. Extraction of the ambience components may be performed such that a phase relationship of the ambience components is maintained and full correlation (both positive and negative) may be avoided. In some cases, maintenance of the phase relationship is achieved at the cost of reducing suppression of the direct sound in the extracted ambience components, such that a listening experience may be improved. This trade-off between may be controlled by a single tuning parameter which is used to calculate crosstalk coefficients (also known as crosstalk weights). The tuning parameter may also affect same-side ambience extraction coefficients. In one embodiment, the same-side ambience extraction coefficients are adjusted to maintain the energy of the extracted ambience regardless of the choice of the tuning parameter. The crosstalk and same-side coefficients may generally be referred to as the ambience extraction coefficients and may be applied to extract ambience components from the channels of the multi-channel stereo signal.

According to one embodiment, a multichannel input signal is converted into time-frequency representation, a cross-correlation coefficient is computed for each time and frequency in the time-frequency representation, an autocorrelation is computed for each time and frequency in the time-frequency representation, and crosstalk and same-side coefficients are computed using the cross-correlation coefficient and the autocorrelation. The crosstalk coefficients are computed as a function of a tuning parameter, where the crosstalk coefficients are proportional to the tuning parameter and where the tuning parameter is between a value of 0 and 1. The same-side coefficients may also be computed as a function of the tuning parameter. The crosstalk and same-side coefficients are applied to extract left and right ambience components.

In one embodiment, the crosstalk coefficients are also inversely proportional to the tuning parameter. In one embodiment, for the tuning parameter having an inversely proportional relationship to the crosstalk coefficients, the tuning parameter is included in a square root expression. In some embodiments, the tuning parameter is fixed, and in other embodiments, the tuning parameter is variable. In one embodiment, the tuning parameter may be fixed at a value of 0.5 or 0.7.

In one embodiment, when equal levels of ambience exist in the respective channels of the multichannel input signal, the relationship between a cross-correlation coefficient of the extracted left and right ambience components and the cross-correlation coefficient of the multichannel input signal is non-linear, as a function of the tuning parameter. In one embodiment, when equal levels of ambience exist in the respective channels of the multichannel input signal, the relationship between a cross-correlation coefficient of the extracted left and right ambience components and a cross-correlation coefficient of the multichannel input signal has a general shape of a sine wave, a hyperbolic sine function, an inverse sine function, or a hyperbolic inverse sine function.

The ambience extraction techniques described herein are implemented in a time-frequency analysis-synthesis framework. In general, expressions in this description are derived for analytical (complex) time-domain signals of arbitrary limited duration determined by the chosen time resolution. The complex formulation enables applying the equations directly to individual transform indices (frequency bands) resulting from short-time Fourier transform (STFT) of the input signals. Moreover, the equations hold without modifications for real signals, and could readily be applied to other time-frequency signal representations, such as sub-band signals derived by an arbitrary filter bank. Furthermore, operations are assumed to be performed independently in each frequency band of interest. The (subband) time domain signals are generally column vectors. However, in order to improve the clarity of presentation, the time- and/or frequency-dependence are in some cases not explicitly notated and the vector sign is omitted.

These ambience extraction techniques described herein are based on a signal model and certain assumptions about the relative ambience levels within the input channels. In a first embodiment, equal ratios are assumed within the respective channels (e.g., left and right channels) of the input signal. In a second embodiment, equal levels of ambience in the respective channels (e.g., left and right channels) of the input signal are assumed. In general, channels of a two-channel input signal are referred to as "left" and "right" channels. In embodiments involving a multi-channel input signal, any pair of channels may be considered for ambience extraction.

Signal Model

In this description, left and right channels {L, R} of the input signal are assumed to each be composed of a primary component and an ambience component:

$$L(t,f)=D_L(t,f)+A_L(t,f)$$

$$R(t,f)=D_R(t,f)+A_R(t,f) \quad (1)$$

where t represents time, f represents frequency, $D_L$ represents the primary (direct) component of the left channel, $D_R$ represents the primary component of the right channel, $A_L$ represents the ambience component of the left channel and $A_R$ represents the ambience component of the right channel. Any suitable time-frequency transform may be used to convert the input signals into a time-frequency representation.

The cross-correlation $r_{XY}$ between two signals X and Y, at a single frequency band and within a time period of interest T, may be computed as follows:

$$r_{XY}(T, f) = \sum_T X^*(t, f)Y(t, f) \quad (2)$$

where ( )* denotes complex conjugation. In one embodiment, the time period of interest T may be weighted with a time window.

Various energy levels P of the left channel L, the right channel R, the primary component of the left channel $D_L$, and the primary component of the right channel $D_R$, respectively, may be expressed as follows:

$$P_L = \|L\|^2 = r_{LL} \quad (3)$$

$$P_R = \|R\|^2 = r_{RR}$$

$$P_{D_L} = \|D_L\|^2$$

$$P_{D_R} = \|D_R\|^2$$

where $\|\cdot\|$ denotes an $L^2$ norm (Euclidean norm) over the same time-frequency window as used in the cross-correlation computation (2), $r_{LL}$ is the autocorrelation of the left channel, and $r_{RR}$ is the autocorrelation of the right channel. For clarity of presentation, time- and/or frequency-dependence has not been explicitly notated.

It is assumed that energy levels of the ambience components in the respective channels (e.g., left and right channels) of the input signal are equal:

$$\|A_L\|^2 = \|A_R\|^2 = P_A, \quad (4)$$

where $P_A$ represents the energy level of the ambience components.

It is also assumed that the primary component of the left channel $D_L$ and the primary component of the right channel $D_R$ are fully correlated with respect to phase, that the left and right ambience components $\{A_L, A_R\}$ are mutually uncorrelated, and that the left and right ambience components $\{A_L, A_R\}$ are uncorrelated with the primary component $D_R$.

With the above assumptions, the energy of the left and right channels may be represented by:

$$P_L = P_{D_L} + P_A \quad (5)$$

$$P_R = P_{D_R} + P_A$$

The cross-correlation $r_{LR}$ between the left and right channels {L, R} of the input signal may computed according to:

$$|r_{LR}| = \sqrt{P_{D_L} P_{D_R}}, \quad (6)$$

Thus, $$P_A = \frac{1}{2}(P_L + P_R - \sqrt{(P_L - P_R)^2 + 4|r_{LR}|^2}) \quad (7)$$

and $$P_{D_L} = P_L - P_A$$

$$P_{D_R} = P_R - P_A \quad (8)$$

Ambience Extraction without Crosstalk

Based on the signal model defined above, a multi-channel ambience extraction process according to one embodiment will now be described. This process may be described as follows:

$$\hat{A}_L(t,f) = w_L(t,f)L(t,f)$$

$$\hat{A}_R(t,f) = w_R(t,f)R(t,f) \qquad (9)$$

where $w_L(t, f)$ and $w_R(t, f)$ are coefficients for ambience extraction, t is time and f is frequency. $w_L(t, f)$ and $w_R(t, f)$ may also be referred to as weights for ambience extraction or a mask for ambience extraction. The terms "weights" and "coefficients" may be used interchangeably.

Omitting the time- and/or frequency-dependence notation, the coefficients for ambience extraction may be computed as follows:

$$w_L = \sqrt{\frac{P_A}{P_L}} \qquad (10)$$

$$w_R = \sqrt{\frac{P_A}{P_R}}$$

Similarly, the primary components of the left and right channels may be described by the following:

$$\hat{D}_L(t,f) = w_{Ldir}(t,f)L(t,f)$$

$$\hat{D}_R(t,f) = w_{Rdir}(t,f)R(t,f) \qquad (11)$$

where $w_{Ldir}(t, f)$ and $w_{Rdir}(t, f)$ are coefficients for extraction of the primary component, t is time and f is frequency. Omitting the time- and/or frequency-dependence notation, the coefficients for extraction of the primary components may be computed as follows:

$$w_{Ldir} = \sqrt{\frac{P_{D_L}}{P_L}} = \sqrt{1 - \frac{P_A}{P_L}} \qquad (12)$$

$$w_{Rdir} = \sqrt{\frac{P_{D_R}}{P_R}} = \sqrt{1 - \frac{P_A}{P_R}}$$

Least-Squares Solution

In this embodiment, to improve separation of the ambient components of the input signal from the primary components of the input signal, the following ambience estimation is used:

$$\hat{A}_L(t,f) = w_{LL}(t,f)L(t,f) + w_{RL}(t,f)R(t,f)$$

$$\hat{A}_R(t,f) = w_{LR}(t,f)L(t,f) + w_{RR}(t,f)R(t,f) \qquad (13)$$

where $w_{LL}$ represents a same-side ambience extraction coefficient for the left channel, $w_{RL}$ represents a crosstalk ambience extraction coefficient for the left channel, $w_{RR}$ represents a same-side ambience extraction coefficient for the right channel and $w_{LR}$ represents a crosstalk ambience extraction coefficient for the right channel.

It is noted that a least-squares solution for real signals is known, where weights are derived to minimize an estimation error and signals are then post-scaled to correct the energy levels. (See C. Faller, "Multiple-Loudspeaker Playback of Stereo Signals," J. Audio Eng. Soc., Vol. 54, No. 11, 2006, pp. 1051-1064.)

For complex signals, such as signals in the short time Fourier transfer (STFT) domain, a similar solution may be provided. For the left channel, the estimation error for the ambience component may be described as:

$$e_L = (-w'_{LL} - w'_{RL}\gamma)S + (1 - w'_{LL})A_L - w'_{RL}A_R \qquad (14)$$

where all quantities are complex, where $S = D_L$ and $\gamma S = D_R$, and where $\gamma$ is the complex magnitude ratio of the direct components of the left and right channels, and $w'_{LL}$, $w'_{RL}$ are complex ambience extraction coefficients of the left channel.

Based on the signal model described above, the energy of the error signal for the left channel is computed as follows:

$$\|e_L\|^2 = \sum_T e_L^* e_L = \qquad (15)$$

$$= (1 + |w'_{LL}|^2 - 2\mathrm{Re}\{w'_{LL}\} + |w'_{LR}|^2)P_A +$$

$$(|w'_{LL}|^2 + |w'_{LR}|^2|\gamma|^2 + w'^*_{LL}w'_{RL}\gamma + w'_{LL}w'^*_{RL}\gamma^*)P_S$$

Assuming the complex coefficients have the following relationship:

$$w'_{LL} = w'_{LLr} + iw'_{LLi} \text{ and } w'_{RL} = w'_{RLr} + iw'_{RLi},$$

where i is the imaginary unit and all partial derivatives have been set to zero, the following equations may derived:

$$\frac{\partial \|e_L\|^2}{\partial w'_{LLr}} = 2[w'_{LLr}P_L - P_A + (w'_{RLr}\mathrm{Re}\{\gamma\} - w'_{RLi}\mathrm{Im}\{\gamma\})P_S] = 0 \qquad (16)$$

$$\frac{\partial \|e_L\|^2}{\partial w'_{LLi}} = 2[w'_{LLi}P_L + (w'_{RLi}\mathrm{Re}\{\gamma\} - w'_{RLr}\mathrm{Im}\{\gamma\})P_S] = 0$$

$$\frac{\partial \|e_L\|^2}{\partial w'_{LRr}} = 2[w'_{RLr}P_R + (w'_{LLr}\mathrm{Re}\{\gamma\} + w'_{LLi}\mathrm{Im}\{\gamma\})P_S] = 0$$

$$\frac{\partial \|e_L\|^2}{\partial w'_{LLi}} = 2[w'_{RLi}P_R + (w'_{LLi}\mathrm{Re}\{\gamma\} - w'_{LLr}\mathrm{Im}\{\gamma\})P_S] = 0$$

Using equation (5) described above, the complex ambience extraction coefficients for the left channel can be expressed as follows:

$$w'_{LL} = \frac{P_R}{P_R + P_{D_L}} \qquad (17)$$

$$w'_{RL} = -\frac{P_S}{P_R}\gamma^* w'_{LL} = \frac{P_S\gamma^*}{P_R + P_{D_L}}$$

In one embodiment, post-scaling to correct the energy levels (mentioned above) may also be incorporated into computation of coefficients for ambience extraction. For a scaled ambience signal with energy $P_A$, it is defined that:

$$\hat{A}_L = \sqrt{\frac{P_A}{\|A'\|^2}} A'_L = \sqrt{\frac{P_A}{\|w'_{LL}L + w'_{RL}R\|^2}} (w'_{LL}L + w'_{RL}R) \qquad (18)$$

$$= w_{LL}L + w_{RL}R$$

Thus, the ambience extraction coefficients for the left channel may be expressed as:

$$w_{LL} = \sqrt{\frac{P_A}{\|A'\|^2}} w'_{LL} \qquad (19)$$

$$w_{RL} = \sqrt{\frac{P_A}{\|A'\|^2}} w'_{RL}$$

or, $$w_{LL} = \sqrt{w'_{LL}} = \sqrt{\frac{P_R}{P_R + P_{D_L}}} \quad (20)$$

$$w_{RL} = -\frac{P_S}{P_R}\gamma^* \sqrt{|w'_{LL}|} = -\frac{r^*_{LR}}{\sqrt{P_R(P_R + P_{D_L})}}$$

where $w_{LL}$ represents same-side ambience extraction coefficients of the left channel and $w_{RL}$ represents crosstalk ambience extraction coefficients of the left channel.

The ambience extraction coefficients for the right channel may similarly be derived and such derivation is not shown here. The ambience extraction coefficients (same-side and crosstalk) for both the left and right channels may be expressed as follows:

$$w_{LL} = \sqrt{\frac{P_R}{P_R + P_{D_L}}} \quad (21)$$

$$w_{RL} = -\frac{r^*_{LR}}{\sqrt{P_R(P_R + P_{D_L})}}$$

$$w_{RR} = \sqrt{\frac{P_L}{P_L + P_{D_R}}}$$

$$w_{LR} = -\frac{r_{LR}}{\sqrt{P_L(P_L + P_{D_R})}}$$

Limited Crosstalk

Generally, negative crosstalk resulting from ambience extraction according to equation (21) cancels out the estimated primary component of the left and right channels of the input signal, effectively separating the ambience components of the left and right channels of the input signal. However, the inventors herein have recognized that performing ambience extraction according to equation (21) results in the extracted left and right ambience components being negatively correlated (e.g., in opposite phase). Both positive and negative correlation of the left and right ambience components are generally undesirable, since in some cases such correlation results in an unpleasant listening experience. Also problematic is that estimation errors and non-stationarity within the adopted time-frequency resolution can lead to a distorted residual primary component remaining audible in the extracted ambience components.

As described herein, extraction of the ambience components may be performed such that a phase relationship of the ambience components is maintained and full correlation of the phases (both positive and negative) may be avoided. In one embodiment, it is possible to reduce correlation of the ambience components by limiting the amount of crosstalk in the extracted ambience components, such that processing artifacts are reduced. In some cases, this benefit is achieved at the cost of reduced separation of the ambience components from the primary components. This trade-off may be controlled by a single tuning parameter which is used to calculate crosstalk coefficients (also known as crosstalk weights). The tuning parameter may be selected, such that a listening experience is improved.

In more detail, a cross-correlation coefficient of the left and right channels of the input signal is computed based on the cross-correlation $R_{LR}$ between the left and right channels (computed according to equation (6) above), as well as the autocorrelation of the left channel $r_{LL}$ and the autocorrelation of the right channel $r_{RR}$ (corresponding to energy levels $P_L$, $P_R$ of the left and right channels as defined by equation (3) above). In one embodiment, the cross-correlation coefficient of the input signal may be normalized. In one embodiment, the magnitude of the cross-correlation coefficient is less than or equal to one.

Ambience extraction coefficients (e.g., same-side and crosstalk) may be computed as a product of a term related to the energy level of the ambience components of the input signal $P_A$ and a multiplication factor depending on the cross-correlation coefficient of the input signal. The term related to the energy level of the ambience components $P_A$ may also relate to the autocorrelations $r_{LL}$ and $r_{RR}$ (corresponding to energy levels $P_L$, $P_R$). The magnitude of the cross-correlation coefficient is related to a proportion of the primary component of the left channel of the input signal to the primary component of the right channel of the input signal.

In one embodiment, to reduce crosstalk, modified ambience extraction coefficients including modified same-side coefficients and modified crosstalk coefficients are computed so as to reduce the effect of the cross-correlation coefficient. These modified ambience extraction coefficients are a product of a term related to the energy level of the ambience components of the input signal $P_A$ and a multiplication factor depending on the cross-correlation coefficient of the input signal. Computation of the modified ambience extraction coefficients may also be based on the autocorrelations ILL and $r_{RR}$ (corresponding to energy levels $P_L$, $P_R$). In one embodiment, a term may also be included to preserve energy of the extracted ambience signals.

In one embodiment, a tuning parameter may control the strength of the modified ambience extraction coefficients. For example, the tuning parameter may control the strength of modified crosstalk coefficients between the left and right channels relative to the modified same-side coefficients of the left channel and the right channel. In one embodiment, the modified crosstalk coefficients may be proportional to the cross-correlation coefficient of the input signal. In one embodiment, the modified crosstalk coefficients may be proportional to the tuning parameter. The modified crosstalk coefficients may also be both proportional and inversely proportional to the tuning parameter. In embodiments involving an inversely proportional tuning parameter, the tuning parameter may be included in a square root expression. In one embodiment, the tuning parameter may also affect same-side ambience extraction coefficients. In one embodiment, regardless of the choice of a tuning parameter, the same-side ambience extraction coefficients are adjusted to maintain the energy of the extracted ambience. The tuning parameter may be fixed or variable. In one embodiment, the tuning parameter is between a value of 0 and 1, for example 0.5 or 0.7.

A cross-correlation coefficient of the left and right ambience components extracted from the left and right channels of the input signal can be computed as a function of the cross-correlation coefficient of the left and right channels of the input signal. This relationship is illustrated in FIG. 1 for different values of the tuning parameter $\alpha$. It will be appreciated that the process described above in the "Ambience Extraction Without Crosstalk" section corresponds to the case in which the tuning parameter $\propto$ is equal to a value of zero as shown in FIG. 1. The process described above in the "Least-Squares Solution" section corresponds to the case in which the tuning parameter $\propto$ is equal to a value of one as shown in FIG. 1.

As illustrated by FIG. 1, in a case where the tuning parameter $\propto$ is equal to a value of zero, the cross-correlation coefficient of the extracted left and right ambience components is identical to the cross-correlation coefficient of the input signal. In this case, the ambience extraction process results in limited suppression of the primary components. On the other hand, in a case where the tuning parameter $\propto$ is equal to a value of one, the cross-correlation coefficient of the extracted ambience components is negated. In this case, the extracted ambience components are negatively correlated, resulting in an unpleasant listening experience.

As shown in FIG. 1, cases in which the tuning parameter $\propto$ is in between 0 and 1 provide a cross-correlation coefficient value closer to an ideal value of 0. With the assumption that ambience components of the left and right channels have equal levels of energy, in such cases where the tuning parameter $\propto$ is in between 0 and 1, the relationship shown in FIG. 1 exhibits a non-linear behavior. In particular, for cases where the tuning parameter $\propto$ is in between 0 and 1, the general trend of this relationship as shown in FIG. 1 may have the general shape of a sine wave, a hyperbolic sine function, an inverse sine function, or a hyperbolic inverse sine function.

Figure 2A:
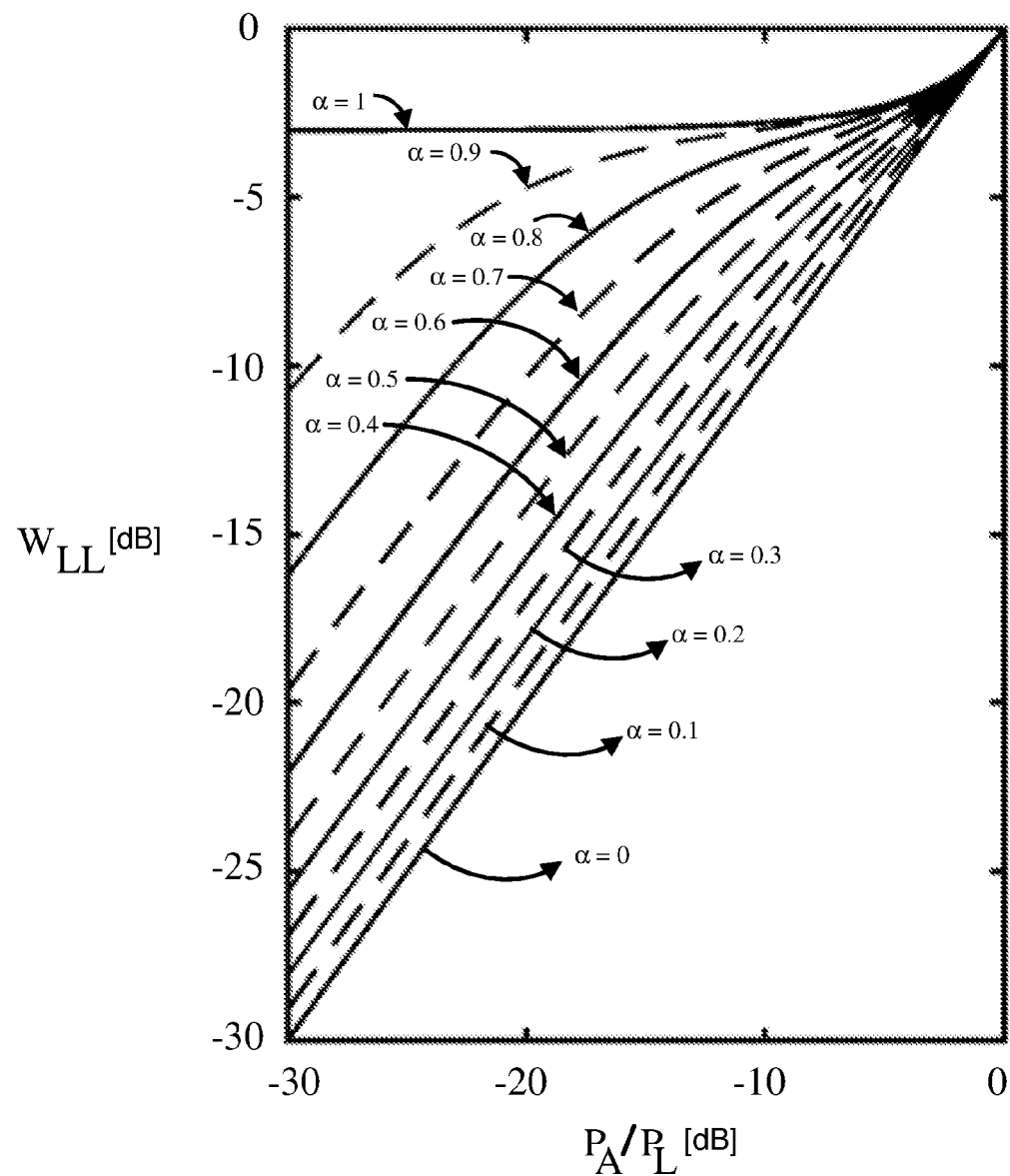
FIG. 2A illustrates a diagram for explaining same-side ambience extraction coefficients for an ambience component of the left channel of an input signal as a function of a tuning parameter, according to an example embodiment.
Figure 2B:
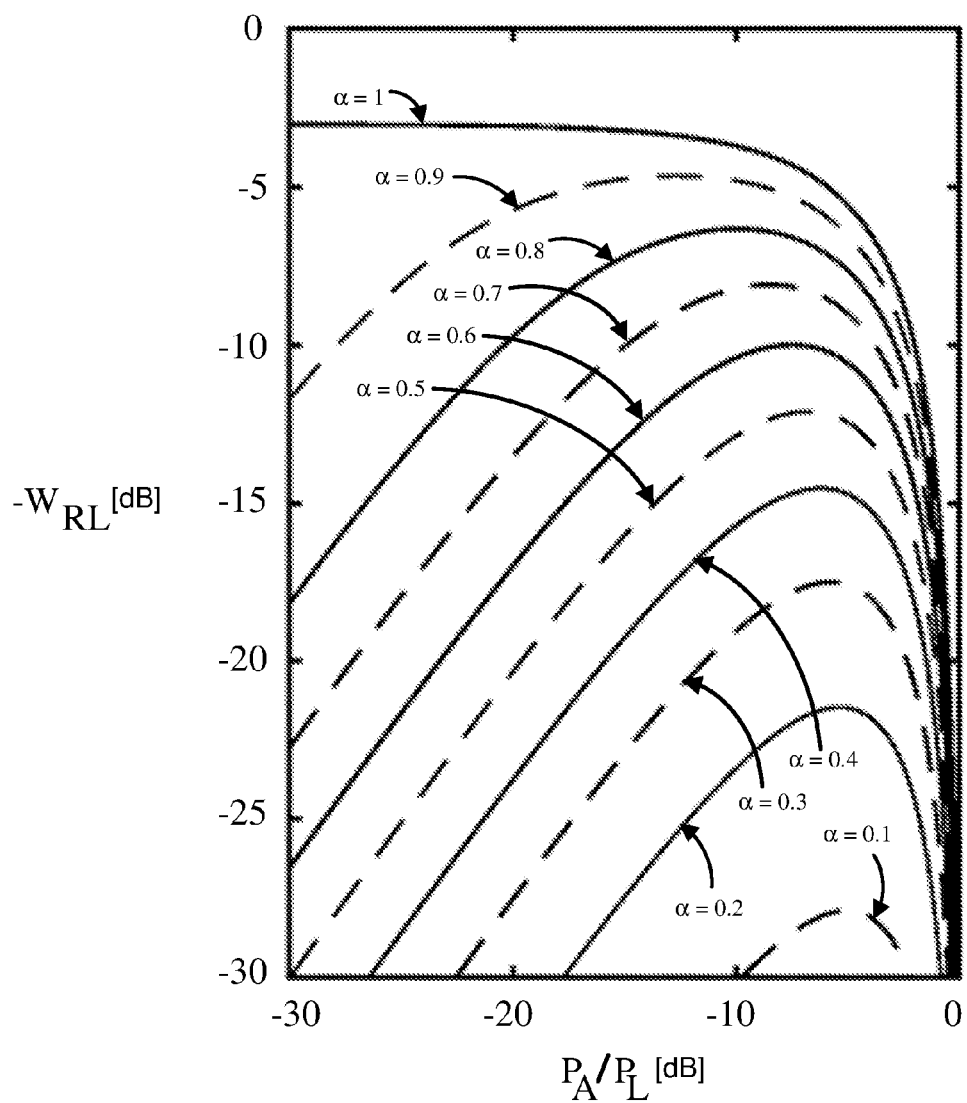
FIG. 2B illustrates a diagram for explaining crosstalk ambience extraction coefficients for an ambience component of the left channel of an input signal as a function of a tuning parameter, according to an example embodiment.

FIGS. 2A and 2B respectively show the same-side ($w_{LL}$) and crosstalk ($w_{RL}$) ambience extraction coefficients for the ambience component of the left channel of the input signal, for difference fractions of ambience and assuming equal energy levels of the primary components in the respective channels (e.g., left and right channels) of the input signal. In one embodiment, the crosstalk ambience extraction coefficients are less than or equal to zero. As shown in FIGS. 2A and 2B, in a case where the tuning parameter $\propto$ is equal to a value of zero, the same-side ambience extraction coefficients follows the ambience fraction in the channel. In a case where the tuning parameter is equal to a value of one, the absolute values of the same-side ambience extraction coefficients are approximately equal to the crosstalk ambience extraction coefficients for small fractions of the ambience, approaching $1/\sqrt{2}$ when the ambience approaches zero. In this case, assuming positively correlated left and right primary components, there is typically near-"perfect" cancellation of the primary component of the input signal; however, there is also typically negative correlation of the extracted left and right ambience components. The term "perfect" is used herein to represent a suitable range, since it will be recognized that achieving "perfect" cancellation of the primary component is not typically possible due to cases in which actual input signals do not follow the assumptions of the signal model and due to errors in estimation of signal quantities.

In FIG. 2B, the lowest curve where the tuning parameter $\propto$ has a value of zero shows the amount the energy level of the input signal can be attenuated to achieve a particular ambience signal energy level. For other values of the tuning parameter, this attenuation occurs due to crosstalk canceling out the primary component in the same-side channel. Any estimation errors, varying levels of a residual primary component, musical noise or other processing artifacts may be audible in the extracted ambience components. As shown in FIGS. 2A and 2B, the tuning parameter can be seen as an upper limit for how much cancellation due to crosstalk is expected. Thus, in addition to improving computation of the cross-correlation of the extracted ambience channels, selecting a value of the tuning parameter to be less than one enables trade-off of reduction of processing artifacts with increased leakage of the primary components into the extracted ambience components.

As previously mentioned, the above approach also applies to real signals. In embodiments involving real signals, real cross-correlation values are used to compute the ambient energy level of the input signal. In one embodiment, this involves directing any correlated ambience components with a 90 degree phase difference into the ambience channels.

Figure 3:
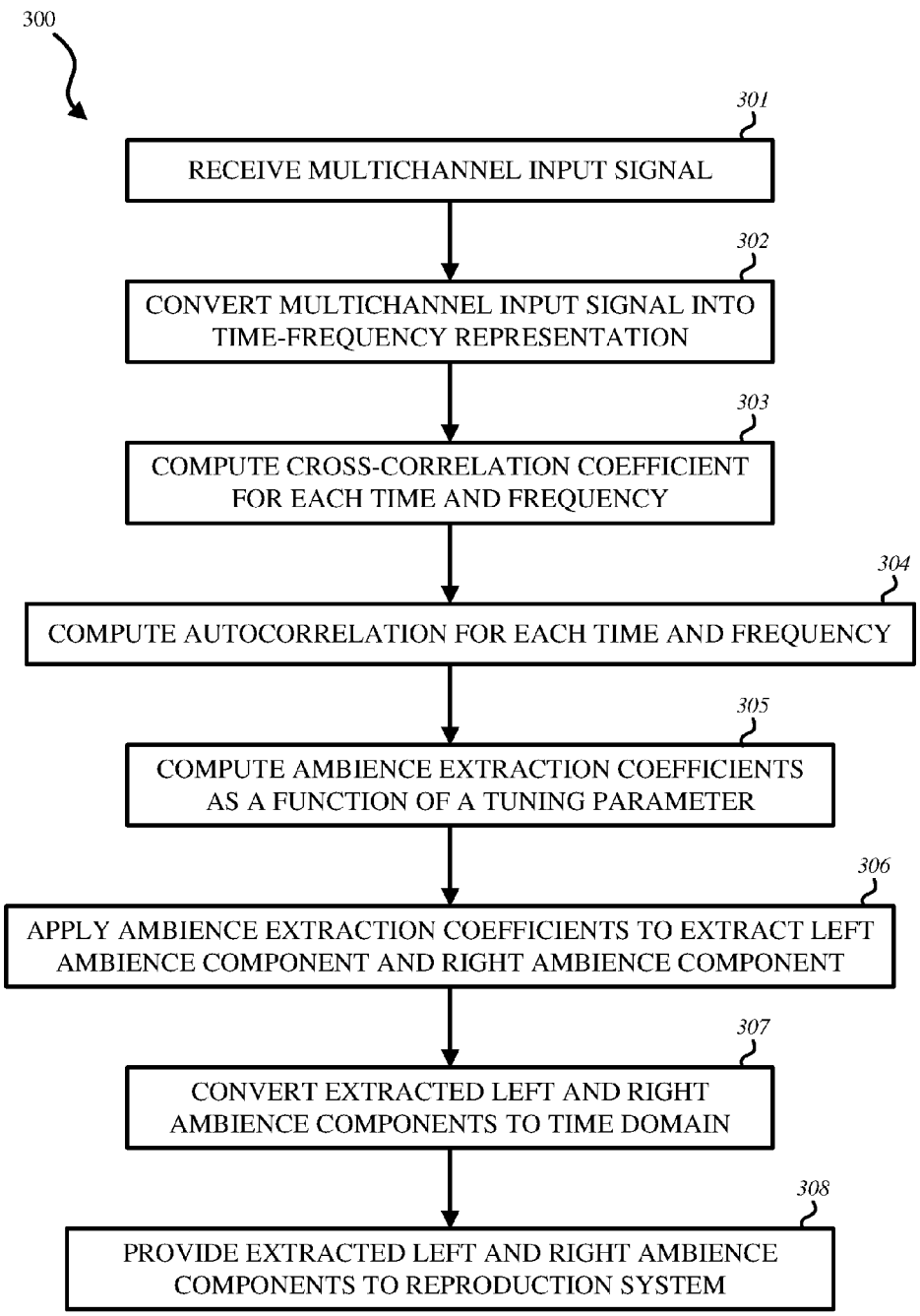
FIG. 3 illustrates a flowchart for explaining a method of extracting ambience in accordance with one example embodiment.

FIG. 3 illustrates a flowchart for providing a general overview of the ambience extraction process in accordance with one example embodiment. The following embodiments may be described as a process 300, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc. Process 300 may be performed by processing logic that includes hardware (e.g. circuitry, dedicated logic, etc.), software (e.g., embodied on a non-transitory computer readable medium), or a combination thereof. In one example embodiment, process 300 is executed by a software driver of a GPU (e.g., GPU 105 or 205) executing on a CPU of the DisplayPort source device.

Referring to FIG. 3, in block 301, the audio processing system receives a multichannel input signal in the time-domain. It is noted that this multichannel approach is different than a single-channel approach in which the left ambience channel is extracted from the left input channel and the right ambience channel is extracted from the right input channel. In block 302, the multichannel input signal is converted into time-frequency representation using any suitable time frequency transform, for example a short-time Fourier transform.

In block 303, the cross-correlation coefficient of the left and right channels of the input signal is computed within a time period of interest for each frequency band. The time period of interest may be approximately 10-20 milliseconds. The frequency band for which the cross-correlation coefficient is computed may be selected or computation may be performed for the full frequency band. As previously described, the cross-correlation coefficient may be computed based on the cross-correlation $r_{LR}$ between the left and right channels and the autocorrelation of the left channel $r_{LL}$ and the autocorrelation of the right channel $r_{RR}$.

In block 304, the autocorrelations of the left and right channels are computed within the time period of interest for each frequency band. In particular, the autocorrelation of the left channel $r_{LL}$ and the autocorrelation of the right channel $r_{RR}$ are defined corresponding to energy levels $P_L$, $P_R$ of the left and right channels according to equation (3) above.

In block 305, ambience extraction coefficients, including crosstalk and same-side coefficients of the left and right channels, are computed as a function of a tuning parameter. In particular, crosstalk coefficients may be computed based on the energy level of the ambience components of the input signal $P_A$, the cross-correlation coefficient of the input signal, and the autocorrelations $r_{LL}$ and $r_{RR}$ (corresponding to energy levels $P_L$, $P_R$). The strength of the crosstalk coefficients may be controlled by a tuning parameter. In one embodiment, the modified crosstalk coefficients may be proportional to the cross-correlation coefficient of the input signal. In one embodiment, the modified crosstalk coefficients may be proportional to the tuning parameter. The modified crosstalk coefficients may also be both proportional and inversely proportional to the tuning parameter. In embodiments involving an inversely proportional tuning parameter, the tuning parameter may be included in a square root expression.

With respect to the same-side coefficients, these may similarly be computed as a function of the tuning parameter. In particular, the same-side coefficients may be computed based on the energy level of the ambience components of the input signal $P_A$, the cross-correlation coefficient of the input signal, and the autocorrelations $r_{LL}$ and $r_{RR}$ (corresponding to energy levels $P_L$, $P_R$). In one embodiment, the same-side coefficient may be expressed in terms of the crosstalk coefficient (e.g., computed using the crosstalk coefficient). The strength of the same-side coefficients may be controlled by the tuning parameter. In one embodiment, the same-side ambience extraction coefficients are adjusted to maintain the energy of the extracted ambience regardless of the choice of the tuning parameter.

The tuning parameter may be fixed or variable. In one embodiment, the tuning parameter is between a value of 0 and 1, for example 0.5 or 0.7. The value of the tuning parameter may be selected based on a desired listening experience. For example, in applications involving headphones, the tuning parameter may be selected such that less suppression of the primary component occurs as a result of ambience extraction. As another example, in applications involving surround speaker systems, the tuning parameter may be selected such that suppression of the primary component is more aggressive as a result of the ambience extraction.

In block 306, the computed ambience extraction coefficients (e.g., crosstalk and same-side coefficients) are applied to the time-frequency representation of the input signal to generate left and right ambience component signals in the time-frequency domain. In block 307, the left and right ambience component signals are converted to time domain by any suitable method, and in block 308 the time-domain signals are provided to the audio processing system for rendering or reproduction.

Figure 4:
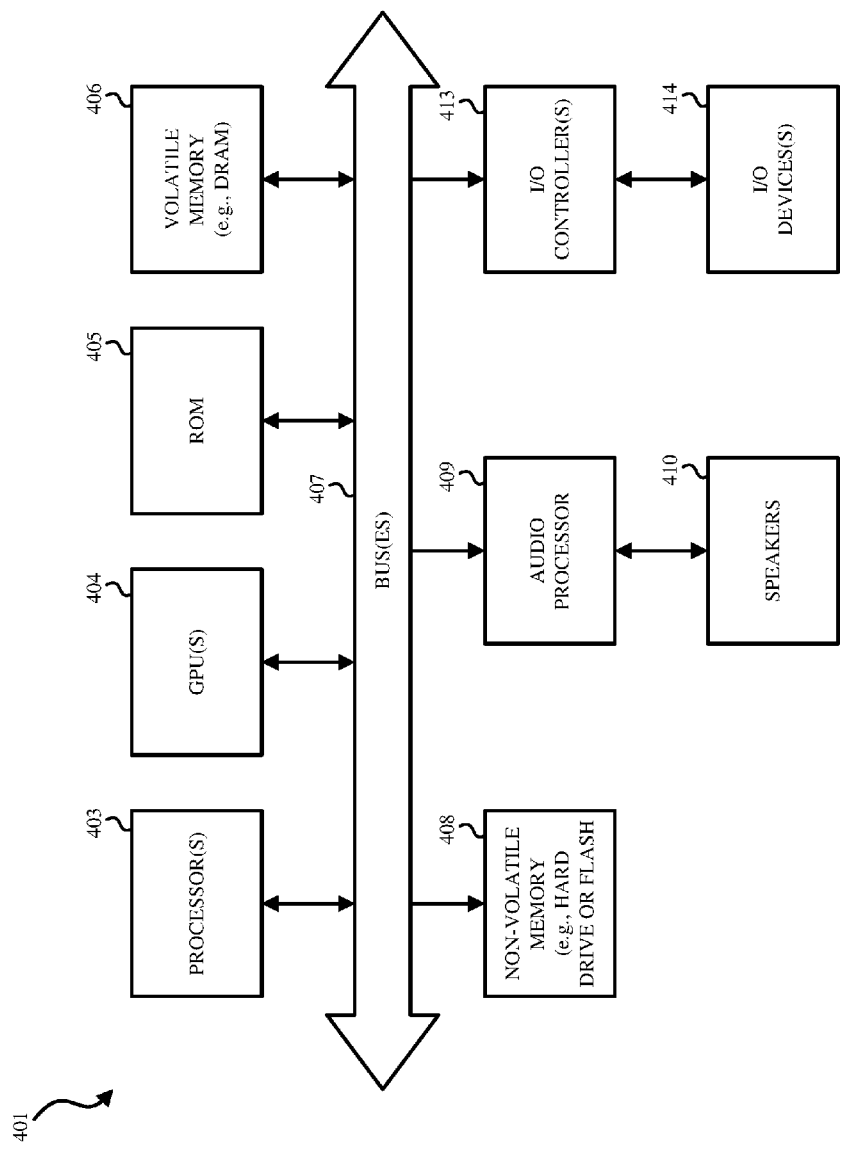
FIG. 4 illustrates an example implementation of an audio system having a programmed processor.

Referring to FIG. 4, FIG. 4 is a block diagram for explaining an example of an audio processing system hardware which may be used with any of the embodiments described herein. This audio processing system can represent a general purpose computer system or a special purpose computer system. Note that while FIG. 4 illustrates the various components of an audio processing system that may be incorporated into headphones, speaker systems, and entertainment systems, it is merely one example of a particular implementation and is merely to illustrate the types of components that may be present in the audio processing system. FIG. 4 is not intended to represent any particular architecture or manner of interconnecting the components as such details are not germane to the embodiments herein. It will also be appreciated that other types of audio processing systems that have fewer components than shown or more components than shown in FIG. 4 can also be used. Accordingly, the processes described herein are not limited to use with the hardware and software of FIG. 4.

As shown in FIG. 4, the audio processing system 401 includes one or more buses 407 that serve to interconnect the various components of the system. One or more processors 403 and one or more graphics processing units (GPUs) are coupled to each other through the one or more buses 407 as is known in the art. The processors may be microprocessors or special purpose processors, such as a processor created through an Application Specific Integrated Circuit (ASIC). Read Only Memory (ROM) 405, volatile memory 406 and non-volatile memory 408 are coupled to the one or more buses 407 using techniques known in the art. Volatile memory 406 may be DRAM. Non-volatile memory 408 may be a hard disk drive or a flash memory or a magnetic optical drive or magnetic memory or an optical drive or other types of memory systems that maintain data even after power is removed from the system. In one embodiment, the processor 403 retrieves computer program instructions stored in a machine readable storage medium such as the ROM 405, the volatile memory 406 or the non-volatile memory 408 or a combination of those memories and executes those instructions to perform operations described herein.

An audio processor 409 is coupled to the one or more buses 407 in order to receive audio signals to be processed and output by speakers 410. The audio processing system can also include one or more input/output (I/O) controllers 413 which provide interfaces for one or more I/O devices 414, such as one or more mice, touch screens, touch pads, joysticks, and other input devices including those known in the art and output devices. The input/output devices 414 are coupled through one or more I/O controllers 413 as is known in the art.

While FIG. 4 shows that the non-volatile memory 408 and the volatile memory 406 are coupled to the one or more buses directly rather than through a network interface, it will be appreciated that the embodiments disclosed herein can utilize non-volatile memory that is remote from the system, such as a network storage device which is coupled to the audio processing system through a network interface such as a modem or Ethernet interface. The buses 407 can be connected to each other through various bridges, controllers and/or adapters as is well known in the art. In one embodiment the I/O controller 413 includes one or more of a USB (Universal Serial Bus) adapter for controlling USB peripherals, an IEEE 1394 controller for IEEE 1394 compliant peripherals, or a Thunderbolt controller for controlling Thunderbolt peripherals. In one embodiment, one or more network device(s) can be coupled to the bus(es) 407. The network device(s) can be wired network devices (e.g., Ethernet) or wireless network devices (e.g., WI-FI, Bluetooth).

Various embodiments descried herein may be embodied, at least in part, in software. That is, the techniques may be carried out in an audio processing system in response to its processor executing a sequence of instructions contained in a storage medium, such as a non-transitory machine-readable storage medium (e.g. DRAM or flash memory). In various embodiments, hardwired circuitry may be used in combination with software instructions to implement the techniques described herein. Thus the techniques are not limited to any specific combination of hardware circuitry and software, or to any particular source for the instructions executed by the audio processing system.

In the description, certain terminology is used to describe features of various embodiments. For example, in certain situations, the terms "component," "unit," "module," and "logic" are representative of hardware and/or software configured to perform one or more functions. For instance, examples of "hardware" include, but are not limited or restricted to an integrated circuit such as a processor (e.g., a digital signal processor, microprocessor, application specific integrated circuit, a micro-controller, etc.). Of course, the hardware may be alternatively implemented as a finite state machine or even combinatorial logic. An example of "software" includes executable code in the form of an application, an applet, a routine or even a series of instructions. As mentioned above, the software may be stored in any type of machine-readable medium.

Some portions of the preceding detailed descriptions have been presented in terms of algorithms and symbolic representations of operations on data bits within a computer memory. These algorithmic descriptions and representations are the ways used by those skilled in the audio processing arts to most effectively convey the substance of their work to others skilled in the art. An algorithm is here, and generally, conceived to be a self-consistent sequence of operations leading to a desired result. The operations are those requiring physical manipulations of physical quantities. It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of an audio processing system, or similar electronic device, that manipulates and transforms data represented as physical (electronic) quantities within the system's registers and memories into other data similarly represented as physical quantities within the system memories or registers or other such information storage, transmission or display devices.

The processes and blocks described herein are not limited to the specific examples described and are not limited to the specific orders used as examples herein. Rather, any of the processing blocks may be re-ordered, combined or removed, performed in parallel or in serial, as necessary, to achieve the results set forth above. The processing blocks associated with implementing the audio processing system may be performed by one or more programmable processors executing one or more computer programs stored on a non-transitory computer readable storage medium to perform the functions of the system. All or part of the audio processing system may be implemented as, special purpose logic circuitry (e.g., an FPGA (field-programmable gate array) and/or an ASIC (application-specific integrated circuit)). All or part of the audio system may be implemented using electronic hardware circuitry that include electronic devices such as, for example, at least one of a processor, a memory, a programmable logic device or a logic gate. Further, processes can be implemented in any combination hardware devices and software components.

While certain embodiments have been described and shown in the accompanying drawings, it is to be understood that such embodiments are merely illustrative of and not restrictive on the broad invention, and the invention is not limited to the specific constructions and arrangements shown and described, since various other modifications may occur to those of ordinary skill in the art. The description is thus to be regarded as illustrative instead of limiting.

The invention claimed is:

1. A method of ambience extraction from a multichannel input signal, the method comprising:
   converting the multichannel input signal into a time-frequency representation;
   computing a cross-correlation coefficient for each time and frequency in the time-frequency representation of the multichannel input signal;
   computing an autocorrelation for each time and frequency in the time-frequency representation of the multichannel input signal;
   computing, using the cross-correlation coefficient and the autocorrelation, ambience extraction coefficients as a function of a tuning parameter, the ambience extraction coefficients including crosstalk coefficients and same-side coefficients, wherein the crosstalk coefficients are proportional to the tuning parameter, and wherein the tuning parameter is between a value of 0 and a value of 1; and
   extracting a left ambience component and a right ambience component by applying the ambience extraction coefficients to the time-frequency representation of the multichannel input signal.

2. The method of claim 1, wherein the crosstalk coefficients are also inversely proportional to the tuning parameter.

3. The method of claim 2, wherein for the tuning parameter having an inversely proportional relationship to the crosstalk coefficients, the tuning parameter is included in a square root expression.

4. The method of claim 1, wherein the tuning parameter is fixed.

5. The method of claim 4, wherein the tuning parameter is 0.5 or 0.7.

6. The method of claim 1, wherein the tuning parameter is variable.

7. The method of claim 1, wherein equal levels of ambience exist in the respective channels of the multichannel input signal, and
   wherein, as a function of the tuning parameter, the relationship between a cross-correlation coefficient of the extracted left and right ambience components and the cross-correlation coefficient of the multichannel input signal is non-linear.

8. The method of claim 1, wherein equal levels of ambience exist in the respective channels of the multichannel input signal, and
   wherein, as a function of the tuning parameter, the relationship between a cross-correlation coefficient of the extracted left and right ambience components and a cross-correlation coefficient of the multichannel input signal has a general shape of a sine wave, a hyperbolic sine function, an inverse sine function, or a hyperbolic inverse sine function.

9. An audio processing system, comprising:
   a processor; and
   a memory having stored therein instructions that when executed by the processor: (a) convert a multichannel input signal into a time-frequency representation; (b) compute a cross-correlation coefficient for each time and frequency in the time-frequency representation of the multichannel input signal; (c) compute an autocorrelation for each time and frequency in the time-frequency representation of the multichannel input signal; (d) compute, using the cross-correlation coefficient and the autocorrelation, ambience extraction coefficients as a function of a tuning parameter, the ambience extraction coefficients including crosstalk coefficients and same-side coefficients; and (e) extract a left ambience component and a right ambience component by applying the ambience extraction coefficients to the time-frequency representation of the multichannel input signal, wherein the crosstalk coefficients are proportional to the tuning parameter, and wherein the tuning parameter is between a value of 0 and a value of 1.

10. The audio processing system of claim 9, wherein the crosstalk coefficients are also inversely proportional to the tuning parameter.

11. The audio processing system of claim 10, wherein for the tuning parameter having an inversely proportional relationship to the crosstalk coefficients, the tuning parameter is included in a square root expression.

12. The audio processing system of claim 9, wherein the tuning parameter is fixed.

13. The audio processing system of claim 12, wherein the tuning parameter is 0.5 or 0.7.

14. The audio processing system of claim 9, wherein the tuning parameter is variable.

15. The audio processing system of claim 9, wherein equal levels of ambience exist in the respective channels of the multichannel input signal, and
wherein, as a function of the tuning parameter, the relationship between a cross-correlation coefficient of the extracted left and right ambience components and the cross-correlation coefficient of the multichannel input signal is non-linear.

16. The audio processing system of claim 9, wherein equal levels of ambience exist in the respective channels of the multichannel input signal, and
wherein, as a function of the tuning parameter, the relationship between a cross-correlation coefficient of the extracted left and right ambience components and a cross-correlation coefficient of the multichannel input signal has a general shape of a sine wave, a hyperbolic sine function, an inverse sine function, or a hyperbolic inverse sine function.

17. A non-transitory computer-readable storage medium storing executable program instructions which when executed by an audio processing system cause the audio processing system to perform a method of ambience extraction from a multichannel input signal, the method comprising:
converting the multichannel input signal into a time-frequency representation;
computing a cross-correlation coefficient for each time and frequency in the time-frequency representation of the multichannel input signal;
computing an autocorrelation for each time and frequency in the time-frequency representation of the multichannel input signal;
computing, using the cross-correlation coefficient and the autocorrelation, ambience extraction coefficients as a function of a tuning parameter, the ambience extraction coefficients including crosstalk coefficients and same-side coefficients, wherein the crosstalk coefficients are proportional to the tuning parameter, and wherein the tuning parameter is between a value of 0 and a value of 1; and
extracting a left ambience component and a right ambience component by applying the ambience extraction coefficients to the time-frequency representation of the multichannel input signal.

18. The non-transitory computer-readable storage medium of claim 17, wherein the crosstalk coefficients are also inversely proportional to the tuning parameter.

19. The non-transitory computer-readable storage medium of claim 18, wherein for the tuning parameter having an inversely proportional relationship to the crosstalk coefficients, the tuning parameter is included in a square root expression.

20. The non-transitory computer-readable storage medium of claim 17, wherein the tuning parameter is fixed.

21. The non-transitory computer-readable storage medium of claim 20, wherein the tuning parameter is 0.5 or 0.7.

22. The non-transitory computer-readable storage medium of claim 17, wherein the tuning parameter is variable.

23. The non-transitory computer-readable storage medium of claim 17, wherein equal levels of ambience exist in the respective channels of the multichannel input signal, and
wherein, as a function of the tuning parameter, the relationship between a cross-correlation coefficient of the extracted left and right ambience components and the cross-correlation coefficient of the multichannel input signal is non-linear.

24. The non-transitory computer-readable storage medium of claim 17, wherein equal levels of ambience exist in the respective channels of the multichannel input signal, and
wherein, as a function of the tuning parameter, the relationship between a cross-correlation coefficient of the extracted left and right ambience components and a cross-correlation coefficient of the multichannel input signal has a general shape of a sine wave, a hyperbolic sine function, an inverse sine function, or a hyperbolic inverse sine function.

* * * * *

UNITED STATES PATENT AND TRADEMARK OFFICE
CERTIFICATE OF CORRECTION

PATENT NO. : 9,928,842 B1
APPLICATION NO. : 15/275312
DATED : March 27, 2018
INVENTOR(S) : Juha O. Merimaa, Bruce C. Po and Adam E. Kriegel It is certified that error appears in the above-identified patent and that said Letters Patent is hereby corrected as shown below:

In the Claims

Column 14, Claim 7, Lines 34-35, please delete "the relationship" and insert --a relationship--.

Column 14, Claim 8, Lines 42-43, please delete "the relationship" and insert --a relationship--.

Column 15, Claim 15, Lines 21-22, please delete "the relationship" and insert --a relationship--.

Column 15, Claim 16, Lines 29-30, please delete "the relationship" and insert --a relationship--.

Column 16, Claim 23, Lines 33-34, please delete "the relationship" and insert --a relationship--.

Column 16, Claim 24, Lines 42-43, please delete "the relationship" and insert --a relationship--.

Signed and Sealed this
Twenty-eighth Day of May, 2019

Andrei Iancu
*Director of the United States Patent and Trademark Office*